(12) United States Patent
Kim et al.

(10) Patent No.: US 12,074,571 B2
(45) Date of Patent: Aug. 27, 2024

(54) SEMICONDUCTOR DEVICE

(71) Applicant: Samsung Electronics Co., Ltd., Suwon-si (KR)

(72) Inventors: Dong Su Kim, Hwaseong-si (KR); Jun Suk Bang, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 182 days.

(21) Appl. No.: 17/885,831

(22) Filed: Aug. 11, 2022

(65) Prior Publication Data

US 2023/0122548 A1  Apr. 20, 2023

(30) Foreign Application Priority Data

Oct. 20, 2021 (KR) .......................... 10-2021-0140074
Apr. 20, 2022 (KR) .......................... 10-2022-0048675

(51) Int. Cl.
*H03F 1/02* (2006.01)
*H02M 1/00* (2006.01)
(Continued)

(52) U.S. Cl.
CPC ........ *H03F 1/0227* (2013.01); *H02M 1/0025* (2021.05); *H02M 3/158* (2013.01);
(Continued)

(58) Field of Classification Search
CPC .... H02M 3/1582; H02M 3/156; H02M 3/157; H02M 3/158; H02M 3/1584; H02M 3/1586; H02M 3/285; H02M 3/33561; H02M 7/49; H02M 1/045; H02M 7/006; H02M 7/06; H02M 7/068; H02M 7/153; H02M 7/10; H02M 1/088; H02M 7/103;
(Continued)

(56) References Cited

U.S. PATENT DOCUMENTS 6,121,761 A  9/2000 Herbert
7,763,994 B2  7/2010 Inomoto
(Continued)

FOREIGN PATENT DOCUMENTS

JP  2020-017266 A  1/2020

OTHER PUBLICATIONS

Search Report issued Dec. 21, 2022 in European Application No. 22185975.4.
(Continued)

*Primary Examiner* — Jeffrey A Gblende
(74) *Attorney, Agent, or Firm* — Harness, Dickey & Pierce, P.L.C.

(57) ABSTRACT

A semiconductor device is provided. The semiconductor device comprises an output terminal from which an output voltage is output, a switching converter configured to control the output voltage on the basis of a first reference voltage, a load capacitor configured to be charged with a voltage corresponding to the output voltage, a linear amplifier connected to one end of an alternating current (AC) coupling capacitor and configured to control a voltage of the AC coupling capacitor on the basis of a second reference voltage, and a switching circuit configured to control a charging speed of the load capacitor and control a connection between the output terminal and one end and another end of the AC coupling capacitor.

20 Claims, 12 Drawing Sheets

(51) Int. Cl.
*H02M 3/158* (2006.01)
*H03F 3/24* (2006.01)
*H03F 3/72* (2006.01)

(52) U.S. Cl.
CPC ............... *H03F 3/245* (2013.01); *H03F 3/72* (2013.01); *H03F 2203/7227* (2013.01)

(58) Field of Classification Search
CPC .......... H02M 7/106; H02M 7/19; H02M 7/08; H02M 7/17; H02M 2001/007; H02M 7/493; H02M 7/53806; H02M 7/5381; H02M 7/483; H02M 7/217; H02M 7/538466; H02M 7/5387; H02M 7/53871; H02M 7/53873; H02M 7/53875; H02M 1/084; H02M 1/0845; H02M 1/007; H02M 1/0009; H02M 1/08; H02M 3/1588; H02M 7/5395; H02M 1/14; H02M 1/0043; H02J 3/46; H02J 3/38; H03F 1/0227; H03F 3/24; H03F 3/245; H03F 3/72
See application file for complete search history.

(56) References Cited

U.S. PATENT DOCUMENTS

| | | | |
|---|---|---|---|
| 8,803,605 | B2 | 8/2014 | Fowers et al. |
| 8,917,069 | B2 | 12/2014 | Howes et al. |
| 9,256,238 | B1 | 2/2016 | Kotikalapoodi |
| 9,473,023 | B2* | 10/2016 | Vannorsdel ........... H03F 1/0227 |
| 9,525,384 | B2 | 12/2016 | Lee et al. |
| 10,270,345 | B1 | 4/2019 | Kotikalapoodi |
| 10,826,436 | B2 | 11/2020 | Kim et al. |
| 2010/0264890 | A1 | 10/2010 | Caldwell |
| 2012/0313701 | A1 | 12/2012 | Khlat et al. |
| 2013/0207731 | A1 | 8/2013 | Balteanu |
| 2017/0187332 | A1* | 6/2017 | Youn ......................... H03F 3/21 |
| 2020/0336111 | A1 | 10/2020 | Khlat |
| 2021/0257971 | A1 | 8/2021 | Kim et al. |

OTHER PUBLICATIONS

Examination issued Jan. 20, 2023 in European Application No. 22185975.4.
Communication pursuant to Article 94(3) EPC issued May 13, 2024 in European Application No. 22 185 975.4.

* cited by examiner

SEMICONDUCTOR DEVICE

This application claims priority from Korean Patent Application Nos. 10-2021-0140074 and 10-2022-0048675 filed on Oct. 20, 2021, and Apr. 20, 2022, respectively, in the Korean Intellectual Property Office, the disclosures of each of which are incorporated herein by reference in their entirety.

BACKGROUND

1. Field of the Disclosure

The present disclosure relates to a semiconductor device.

2. Description of the Related Art

A semiconductor system may include various semiconductor devices that operate with different supply voltages. Accordingly, for smooth operation, the semiconductor system may benefit from a semiconductor device generating various supply voltages as necessary.

For example, in the case of a semiconductor device requiring a high-speed operation, such as a signal transmission and/or reception operation, it is beneficial to supply a changed supply voltage at a high speed. Therefore, active research is underway on a semiconductor device for changing and outputting a supply voltage at a high speed.

SUMMARY

Aspects of the present disclosure provide a semiconductor device that has an increased operating speed and is capable of generating a high voltage.

It should be noted that objects of the present disclosure are not limited to the above-described objects, and other objects which have not been described will be apparent to those skilled in the art from the following descriptions.

According to some aspects of the present disclosure, there is provided a semiconductor device comprising an output terminal, a switching converter configured to control an output voltage output from the output terminal based on a first reference voltage, a load capacitor configured to be charged with a voltage corresponding to the output voltage, a linear amplifier connected to one end of an alternating current (AC) coupling capacitor and configured to control a voltage of the AC coupling capacitor based on a second reference voltage, and a switching circuit connected between the output terminal, the load capacitor and the AC coupling capacitor and configured to control a charging speed of the load capacitor and to control a connection between the output terminal and the one end and a connection between the output terminal and another end of the AC coupling capacitor.

According to some aspects of the present disclosure, there is provided a semiconductor device comprising an output terminal, a switching converter configured to control an output voltage output from the output terminal based on a first reference voltage and a power supply voltage, a load capacitor configured to be charged with a voltage corresponding to the output voltage, a linear amplifier connected to one end of an alternating current (AC) coupling capacitor and configured to control a voltage of the AC coupling capacitor based on a second reference voltage and the power supply voltage, a first switch configured to control a connection between the output terminal and the load capacitor, a second switch configured to control a connection between the output terminal and the one end of the AC coupling capacitor, and a third switch configured to control a connection between the output terminal and another end of the AC coupling capacitor.

According to some aspects of the present disclosure, there is provided a semiconductor device comprising an output terminal, a switching converter configured to control an output voltage output by the output terminal based a first reference voltage and a power supply voltage, a load capacitor configured to be charged with a voltage corresponding to the output voltage, and a first linear amplifier connected to one end of a first alternating current (AC) coupling capacitor and configured to control a voltage of the first AC coupling capacitor based on a second reference voltage and the power supply voltage, wherein, in a first state in which the output voltage is kept constant, the switching converter is configured to generate the output voltage, and the first linear amplifier is configured to charge the first AC coupling capacitor, in a second state in which the output voltage changes to a first voltage lower than a set voltage, the first linear amplifier is configured to generate the output voltage without using the first AC coupling capacitor, and in a third state in which the output voltage changes to a second voltage higher than the set voltage, the first linear amplifier is configured to generate the output voltage using the first AC coupling capacitor.

DETAILED DESCRIPTION OF THE EMBODIMENTS

Figure 1:
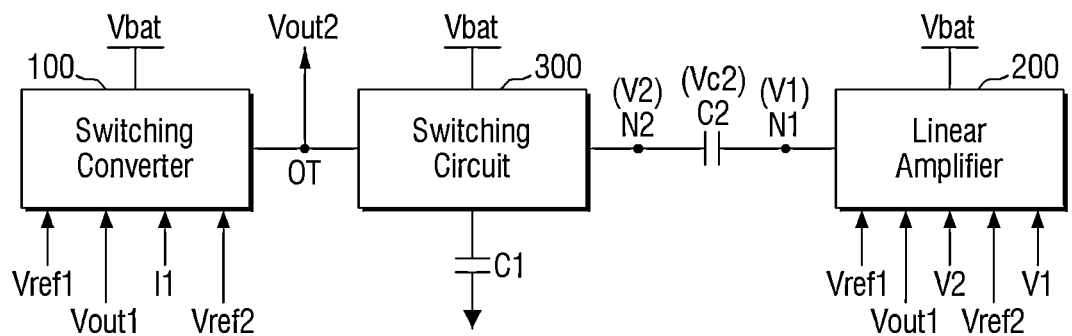
FIG. 1 is a block diagram of a semiconductor device according to some example embodiments.

Hereinafter, some example embodiments according to the technical spirit of the present disclosure will be described with reference to the accompanying drawings. Functional elements in the following description and the corresponding blocks shown in the drawings, unless indicated otherwise, may be implemented in processing circuitry such as hardware, software, or a combination thereof configured to perform a specific function. For example, the processing circuitry may include electrical components such as at least one of transistors, resistors, capacitors, etc. and/or may include electrical components such as logic gates including at least one of AND gates, OR gates, NAND gates, NOT gates, XOR gates, etc.

FIG. 1 is a block diagram of a semiconductor device according to some example embodiments.

Referring to FIG. 1, a semiconductor device 1 may include a switching converter 100, a linear amplifier 200, a switching circuit 300, a load capacitor C1, and an alternating current (AC) coupling capacitor C2.

The semiconductor device 1 may generate an output voltage Vout2 using the switching converter 100, the load capacitor C1, the linear amplifier 200, and the AC coupling capacitor C2, and the generated output voltage Vout2 may function as a supply voltage, e.g., for providing power to electronic parts. These electronic parts may be referred to as the load of the semiconductor device 1.

For example, the generated output voltage Vout2 may be provided to a digital circuit for processing digital signals, an analog circuit for processing analog signals, a radio frequency (RF) circuit for processing RF signals, and/or the like.

In some example embodiments, the semiconductor device 1 may be, for example, a direct current (DC)-DC converter that generates the output power Vout2 by changing a voltage level of an input voltage (e.g., Vbat) which is a DC voltage. However, the example embodiments are not limited thereto, and the technical details of the present embodiment may apply to an AC-DC converter that generates an output voltage by changing the level of an input voltage which is an AC voltage, and/or the like.

The switching converter 100 may, for example, control the generated output voltage Vout2 on the basis of a first reference voltage Vref1.

In some example embodiments, the switching converter 100 may operate by receiving the first reference voltage Vref1, an output voltage Vout1, an output current I1 of the linear amplifier 200, and a voltage Vc2 of the AC coupling capacitor C2.

The first reference voltage Vref1 may be a reference signal for controlling the generation of output voltage Vout2. The switching converter 100 may receive and control the output voltage Vout1 so that the product of the first reference voltage Vref1 and a certain gain becomes the generated output voltage Vout2.

The output current I1 may be a current generated and output by the linear amplifier 200, and the voltage Vc2 of the AC coupling capacitor C2 may be a voltage difference (e.g., V2−V1) between one end N1 and another end N2 of the AC coupling capacitor C2.

In some example embodiments, the switching converter 100 may include a plurality of switches and an inductor therein.

When the first reference voltage Vref1 is changed, the switches disposed in the switching converter 100 are turned on or off. Accordingly, the path of an inductor current flowing through the inductor in the switching converter 100 is changed such that the output of the switching converter 100 may be controlled.

For example, with an increase in the first reference voltage Vref1, the switching converter 100 may increase the output voltage Vout1 using a power supply voltage Vbat so that the generated output voltage Vout2 corresponds to the first reference voltage Vref1; and/or, with a decrease in the first reference voltage Vref1, the switching converter 100 may decrease the output voltage Vout1 using the power supply voltage Vbat so that the generated output voltage Vout2 corresponds to the first reference voltage Vref1. Thereby, the semiconductor device 1 may generate the output voltage Vout2 by maintaining and/or adjusting a level (or magnitude) of the output voltage Vout1 received by the semiconductor device 1. In some example embodiments, the generated output voltage Vout2 may be provided to the switching converter 100 as the output voltage Vout1.

The load capacitor C1 may be charged with a voltage corresponding to the generated output voltage Vout2 output to an output terminal OT. Since the load capacitor C1 is charged with the voltage corresponding to the generated output voltage Vout2, the output voltage Vout2 of the output terminal OT may be maintained.

In some example embodiments, a current output from the switching converter 100 may be used in charging the load capacitor C1 with the voltage corresponding to the generated output voltage Vout2. However, the example embodiments are not limited thereto, and elements other than the switching converter 100 may be used in charging the load capacitor C1.

The linear amplifier 200 may be connected to the one end N1 of the AC coupling capacitor C2. The linear amplifier 200 may control the voltage Vc2 of the AC coupling capacitor C2 on the basis of a second reference voltage Vref2.

In some example embodiments, the linear amplifier 200 may operate by receiving the first reference voltage Vref1, the output voltage Vout1, a voltage V2 of the other end N2 of the AC coupling capacitor C2, the second reference voltage Vref2, and a voltage V1 of the one end N1 of the AC coupling capacitor C2.

The second reference voltage Vref2 may be a reference signal for controlling the voltage Vc2 of the AC coupling capacitor C2. For example, the linear amplifier 200 may control the voltage Vc2 of the AC coupling capacitor C2 so that the product of the second reference voltage Vref2 and a certain gain becomes the voltage Vc2 of the AC coupling capacitor C2. For example, the linear amplifier 200 may operate by receiving the voltage V2 of the other end N2 of the AC coupling capacitor C2 and the voltage V1 of the one end N1 of the AC coupling capacitor C2 which is the output voltage of the linear amplifier 200 itself. In some example embodiments, the generated output voltage Vout2 may be provided to the linear amplifier 200 as the output voltage Vout1.

The switching circuit 300 may control the charging speed of the load capacitor C1 and the connection between the output terminal OT and the one end N1 and the other end N2 of the AC coupling capacitor C2.

In some example embodiments, the switching circuit 300 may include a plurality of switches for performing such an operation. The semiconductor device 1 including an example switching circuit 300 will be described below with reference to FIG. 2, but the embodiments are not limited thereto.

Figure 2:
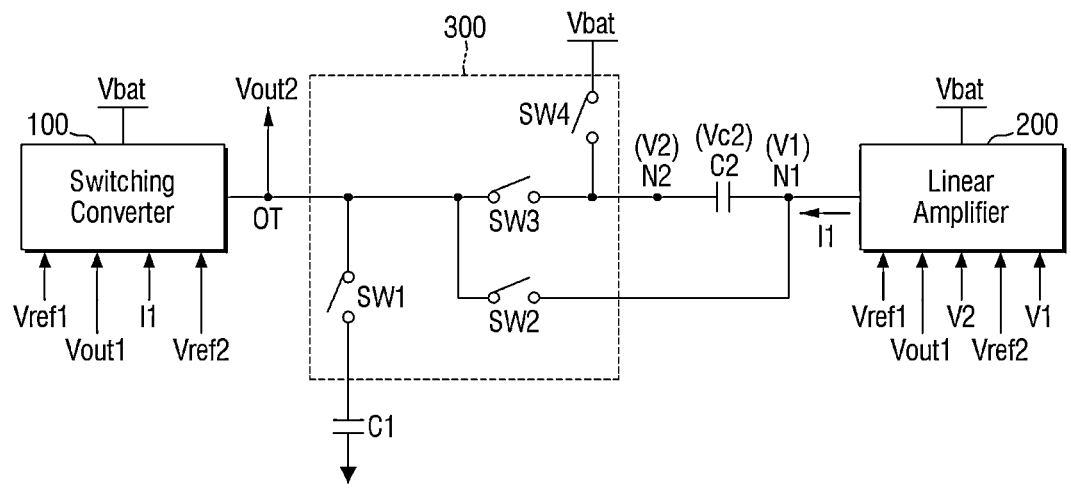
FIG. 2 is a detailed diagram illustrating a switching circuit of FIG. 1.

FIG. 2 is a detailed diagram illustrating the switching circuit of FIG. 1.

Referring to FIG. 2, the switching circuit 300 may include a plurality of switches SW1 to SW4.

The first switch SW1 may be disposed between the switching converter 100 and the load capacitor C1. The first switch SW1 may be disposed between the output terminal OT and the load capacitor C1.

When the semiconductor device 1 operates in a first state, the first switch SW1 may cause the load capacitor C1 to be charged to a voltage corresponding to the generated output voltage Vout2 at a high speed. When the semiconductor device 1 operates in a second state or third state, the first switch SW1 may cause the load capacitor C1 to be charged to a voltage corresponding to the generated output voltage Vout2 at a low speed.

The first state may be a state in which the first reference voltage Vref1 is kept constant and thus, the generated output voltage Vout2 is also kept constant. The state in which the first reference voltage Vref1 is kept constant includes not only a state in which the first reference voltage Vref1 is kept absolutely constant (e.g., at a set value) but also a state in which the first reference voltage Vref1 is kept in a set range. For example, a state in which the first reference voltage Vref1 is kept between 0.99 V and 1.01 V as well as a state in which the first reference voltage Vref1 is constantly kept at 1 V is considered the state in which the first reference voltage Vref1 is kept constant. Accordingly, a state in which the generated output voltage Vout2 is kept constant includes not only a state in which the generated output voltage Vout2 is kept absolutely constant but also a state in which the generated output voltage Vout2 is kept in the set range.

The second state may be, for example, a state in which the first reference voltage Vref1 decreases to a low voltage and thus, the generated output voltage Vout2 also decreases to a low voltage. The third state may be, for example, a state in which the first reference voltage Vref1 increases to a high voltage and thus, the generated output voltage Vout2 also increases to a high voltage. This will be described in further detail below.

In some example embodiments, the first switch SW1 may be a transistor. In this case, the transistor may be completely turned on when the semiconductor device 1 operates in the first state. Accordingly, the load capacitor C1 may fully receive an output current that is output from the switching converter 100 and thus can be charged with a voltage corresponding to the generated output voltage Vout2 at a high speed.

Meanwhile, the transistor may be softly or weakly turned on when the semiconductor device 1 operates in the second state and/or third state. When the transistor is softly turned on, the connection between the load capacitor C1 and the switching converter 100 (and/or the output terminal OT) is not completely disconnected, and the load capacitor C1 slightly maintains the connection with the switching converter 100 and/or the output terminal OT. Accordingly, the load capacitor C1 can receive a part of the output current which is output from the switching converter 100 and thus can be charged with a voltage corresponding to the generated output voltage Vout2 at a low speed. However, the example embodiments are not limited thereto, and the first switch SW1 may be an electronic component (such as a variable resistor, an inductor, and/or the like) which may be configured to turn on, partially on, and/or off.

The second switch SW2 may be disposed between the one end N1 of the AC coupling capacitor C2 and the output terminal OT, and the third switch SW3 may be disposed between the other end N2 of the AC coupling capacitor C2 and the output terminal OT. The fourth switch SW4 may be disposed between the power supply voltage Vbat and the other end N2 of the AC coupling capacitor C2.

In some example embodiments, each of the switches SW2 to SW4 may be a transistor. Unlike the first switch SW1, however, the switches SW2 to SW4 do not operate to be softly turned on and may configured to be completely turned on or off.

Operations of a semiconductor device according to some example embodiments will be described below with reference to FIGS. 3 to 5.

Figure 3:
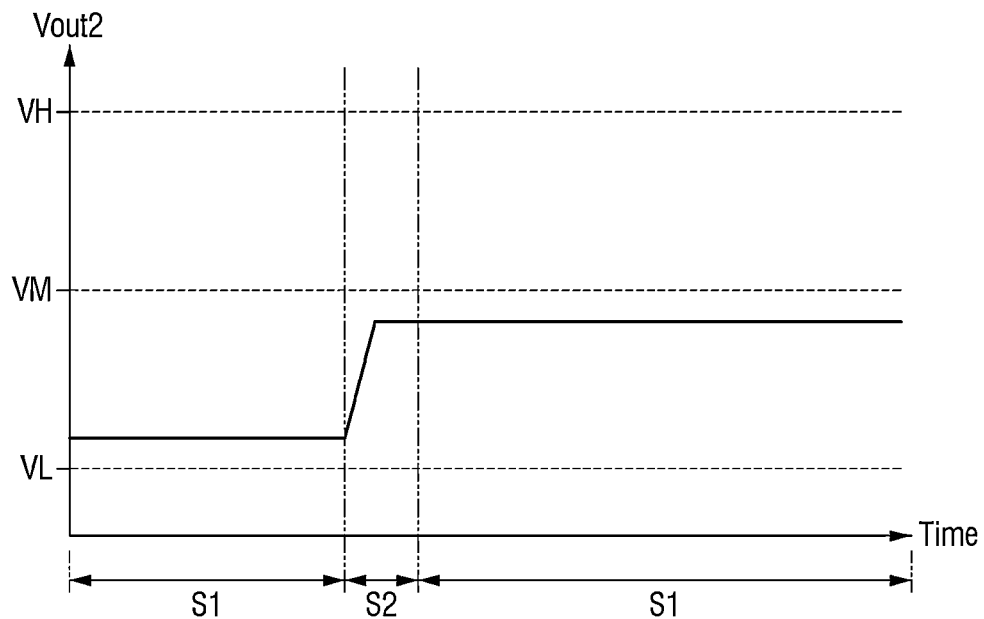
FIG. 3 is a timing diagram illustrating an operation of a semiconductor device according to some example embodiments.

FIG. 3 is a timing diagram illustrating an operation of a semiconductor device according to some example embodiments. FIGS. 4 and 5 are diagrams illustrating an operation of a semiconductor device according to some example embodiments.

Figure 4:
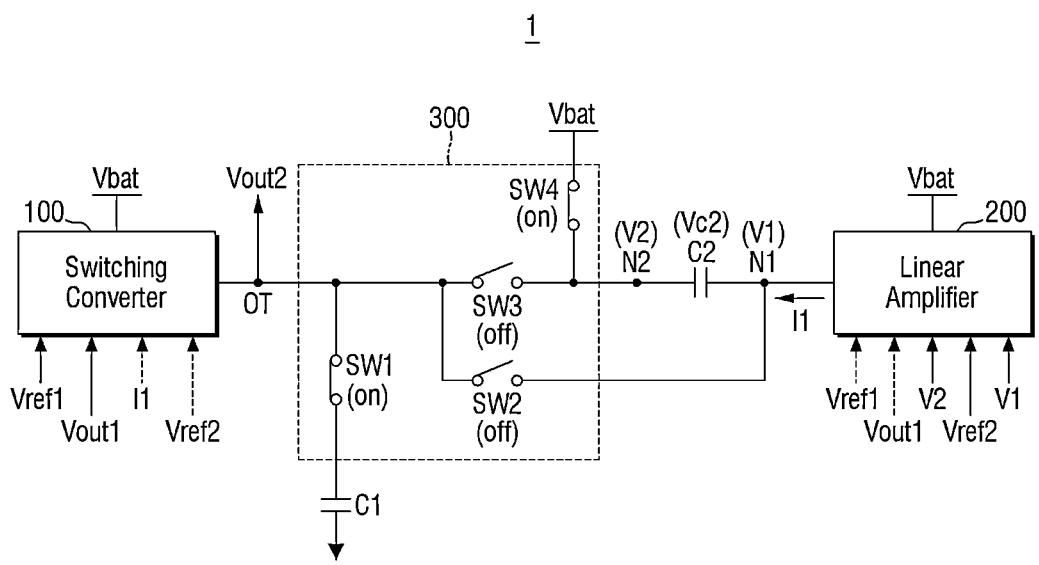
FIGS. 4 and 5 are diagrams illustrating an operation of a semiconductor device according to some example embodiments.

Referring to FIGS. 3 and 4, in a first state S1 in which the generated output voltage Vout2 of the semiconductor device 1 is kept constant between a medium voltage VM and a low voltage VL, the first switch SW1 is turned on, the second and third switches SW2 and SW3 are turned off, and the fourth switch SW4 is turned on.

The switching converter 100 controls the generated output voltage Vout2 on the basis of the first reference voltage Vref1 and the output voltage Vout1. Since the first switch SW1 is turned on (e.g., the transistor is completely turned on), the load capacitor C1 is rapidly charged to a voltage corresponding to the generated output voltage Vout2 by an output current of the switching converter 100.

The linear amplifier 200 controls the voltage Vc2 of the AC coupling capacitor C2 by outputting the output current I1 on the basis of the second reference voltage Vref2, the voltage V1 of the one end N1 of the AC coupling capacitor C2, and the voltage V2 of the other end N2 of the AC coupling capacitor C2.

Since the fourth switch SW4 is turned on, the AC coupling capacitor C2 is charged by the power supply voltage Vbat and the output current I of the linear amplifier 100 such that the voltage Vc2 is generated at the AC coupling capacitor C2.

Since the second switch SW2 and the third switch SW3 are turned off, the linear amplifier 200 and the AC coupling capacitor C2 are not connected to the output terminal OT. In other words, in the state S1 in which the generated output voltage Vout2 is kept constant, the linear amplifier 200 and the AC coupling capacitor C2 are not involved in generating the output voltage Vout2, and the switching converter 100 generates the output voltage Vout2.

Figure 5:
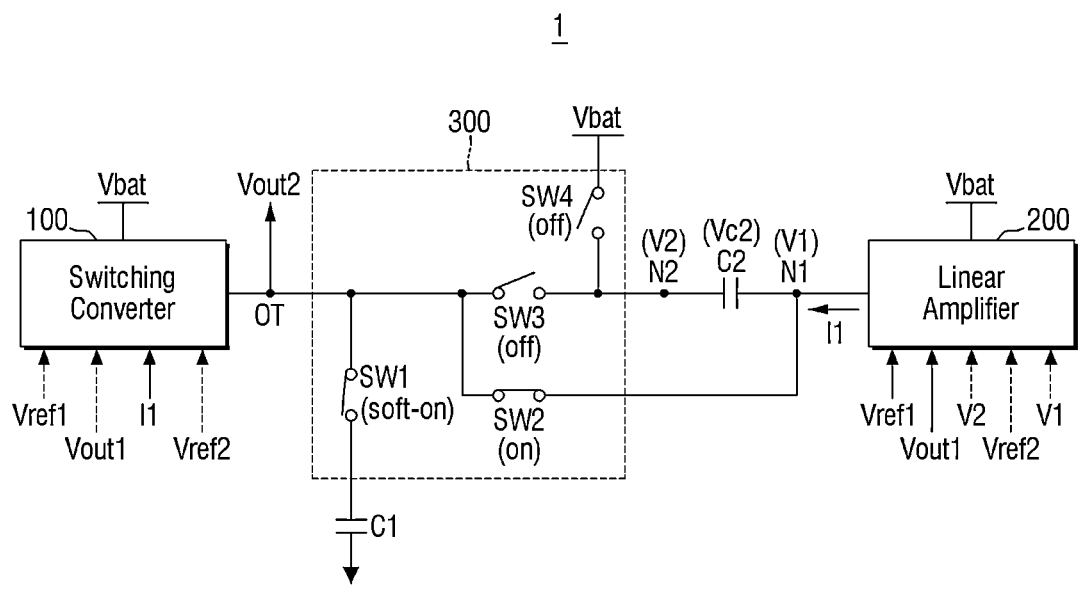

Referring to FIGS. 3 and 5, in a second state S2 in which the generated output voltage Vout2 of the semiconductor device 1 changes to a voltage between the medium voltage VM and the low voltage VL, the first switch SW1 is softly turned on, the second switch SW2 is turned on, and the third and fourth switches SW3 and SW4 are turned off.

The switching converter 100 operates on the basis of the output current I1 of the linear amplifier 200, and the first switch SW1 is softly turned on (the transistor is weakly turned on). Accordingly, the load capacitor C1 is slowly charged to a voltage corresponding to the generated output voltage Vout2 by the output current of the switching converter 100 and/or the output current I1 of the linear amplifier 200.

Since the second switch SW2 is turned on, the linear amplifier 200 controls the generated output voltage Vout2 on the basis of the first reference voltage Vref1 and the output voltage Vout1. Since the third switch SW3 is turned off the voltage Vc2 of the AC coupling capacitor C2, which has been charged in the first state S1, is not involved in generating the output voltage Vout2.

In other words, in the second state S2, the semiconductor device 1 increases the generated output voltage Vout2 to a target voltage corresponding to the first reference voltage Vref1 at a high speed using the linear amplifier 200. In this case, the load capacitor C1 having a high capacity is weakly connected to the output terminal OT (the first switch SW1 is softly turned on) and thus is slowly charged to a voltage corresponding to the generated output voltage Vout2 while the second state S2 is maintained. Also, the load capacitor C1 does not reduce the speed at which the generated output voltage Vout2 increases to the target voltage corresponding to the first reference voltage Vref1.

This will be described in further detail below with reference to FIGS. 6 and 7.

Figure 6:
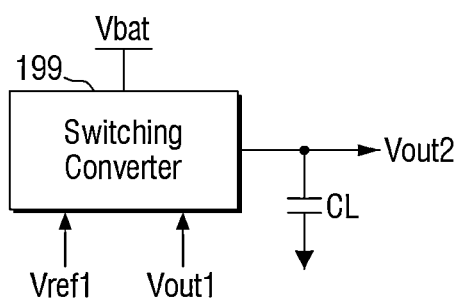
FIGS. 6 and 7 are diagrams illustrating effects of a comparative semiconductor device.
Figure 7:
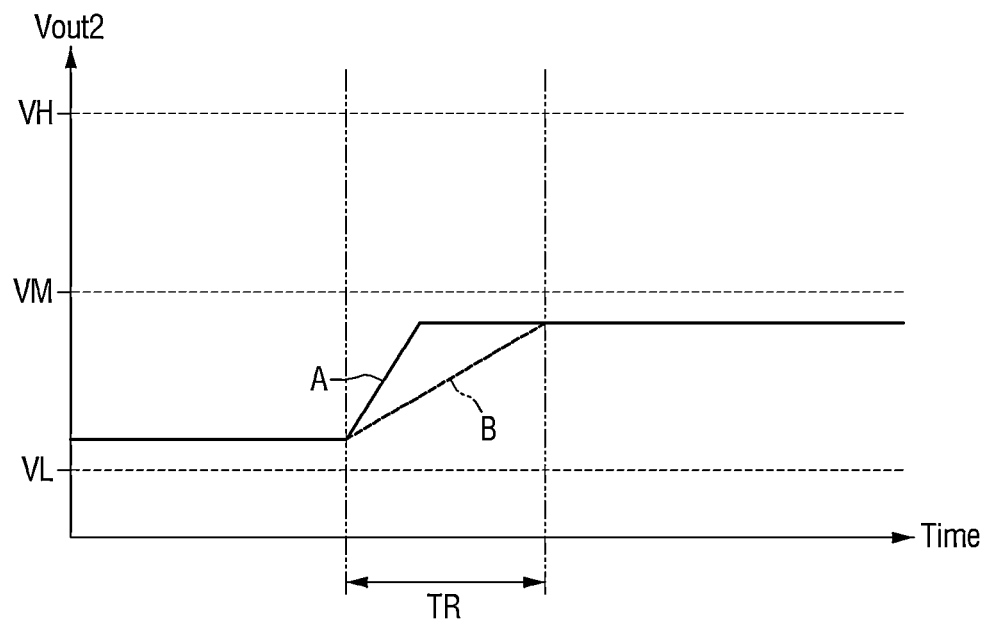

FIGS. 6 and 7 are diagrams illustrating effects of a comparative semiconductor device.

First, FIG. 6 shows a semiconductor device 99 which includes a switching converter 199 and a load capacitor CL unlike the above-described example embodiment.

The switching converter 199 may control an output of an output voltage Vout2 on the basis of a first reference voltage Vref1 and an output voltage Vout1.

To increase the generated output voltage Vout2 of the semiconductor device 99 shown in FIG. 6, the switching converter 199 increases an output current according to an increase in the first reference voltage Vref1. However, the load capacitor CL having a large capacity is connected to the switching converter 199, and thus a large portion of the output current of the switching converter 199 is used in charging the load capacitor CL. Accordingly, the generated output voltage Vout2 of the semiconductor device 99 does not rapidly increase in a transition section TR as indicated by B in FIG. 7.

The rise speed (or rise rate) of the generated output voltage Vout2 increases when the output current of the switching converter 199 increases. Since there is generally a limit to the amount of current flowing in a semiconductor device, it is difficult to design the rise speed to be infinitely high.

Also, the rise speed (or rise rate) of the output voltage Vout2 increases when the capacity of the load capacitor CL decreases. However, when the capacity of the load capacitor CL decreases, an output ripple voltage increases. Accordingly, it is also difficult to design the capacity of the load capacitor CL to be small.

Therefore, the generated output voltage Vout2 of the semiconductor device 99 shows a low rise speed as indicated by B due to an operation of charging the load capacitor CL in the transition section TR of the generated output voltage Vout2.

On the other hand, in the semiconductor device 1 according to the present embodiment, the first switch SW1 disposed between the load capacitor C1 having a large capacity and the output terminal OT or the switching converter 100 is softly turned on in the transition section TR of the generated output voltage Vout2 as shown in FIG. 5. Accordingly, the load capacitor C1 is slowly charged to a voltage corresponding to the generated output voltage Vout2 in the transition section TR but does not have as great an influence on an increase in the generated output voltage Vout2 as in the above-described semiconductor device 99. Also, in the semiconductor device 1 according to the present embodiment, the generated output voltage Vout2 can rapidly increase to a target voltage using the linear amplifier 200 in the transition section TR of the generated output voltage Vout2 as indicated by A in FIG. 7. Accordingly, the operating speed of the semiconductor device 1 can be increased.

Referring to FIG. 3, when the generated output voltage Vout2 reaches the target voltage and the load capacitor C1 is fully charged, the semiconductor device 1 operates again in the first state S1 in which the generated output voltage Vout2 is kept constant between the medium voltage VM and the low voltage VL. In this case, the semiconductor device 1 performs the operation described above with reference to FIG. 4 again.

In some example embodiments, the medium voltage VM may be a voltage having a similar level to the power supply voltage Vbat. In this case, the low voltage VL may be a voltage having a lower level than the power supply voltage Vbat, and a high voltage VH may be a voltage having a higher level than the power supply voltage Vbat. However, embodiments are not limited thereto.

Figure 8:
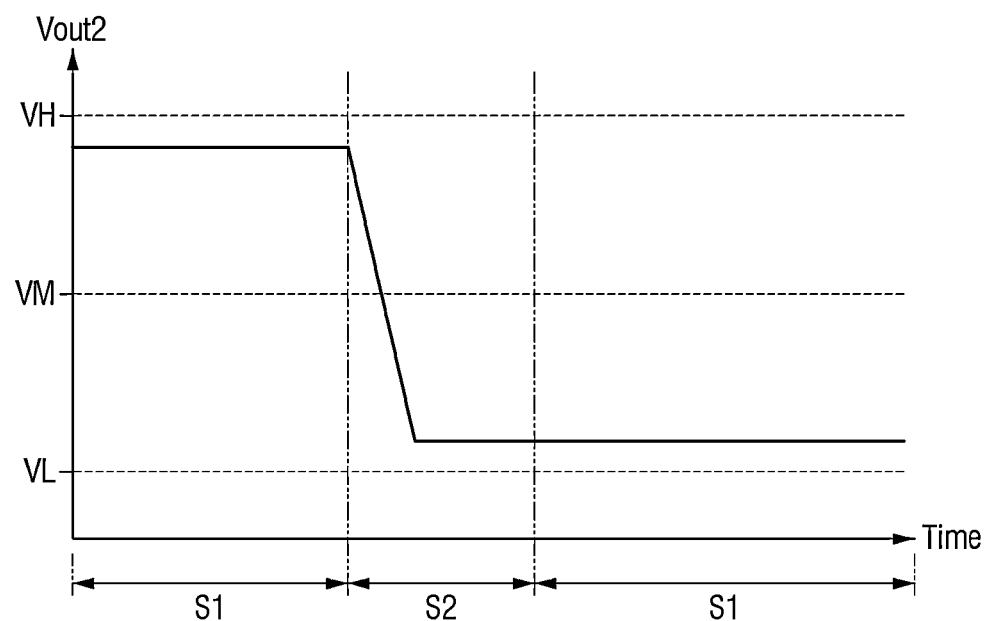
FIGS. 8 and 9 are timing diagrams illustrating an operation of a semiconductor device according to other example embodiments.
Figure 9:
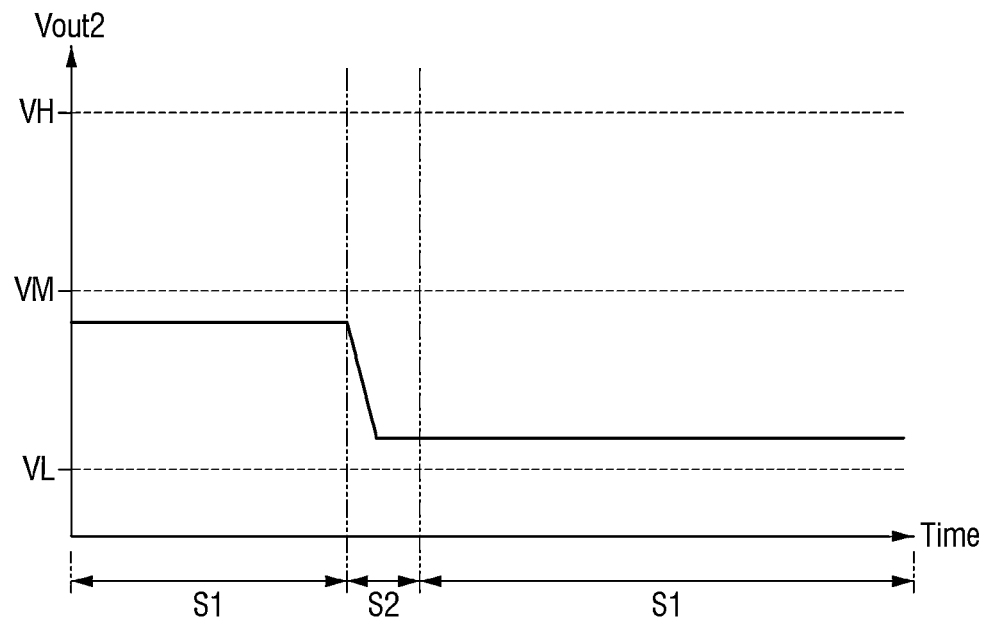

FIGS. 8 and 9 are timing diagrams illustrating an operation of a semiconductor device according to other example embodiments.

First, referring to FIG. 8, in the first state S1 in which the generated output voltage Vout2 of the semiconductor device 1 is kept constant between the medium voltage VM and the high voltage VH, the semiconductor device 1 performs the operation described above with reference to FIG. 4. In other words, the first switch SW1 may be turned on, the second and third switches SW2 and SW3 may be turned off, and the fourth switch SW4 may be turned on.

Subsequently, in the second state S2 in which the generated output voltage Vout2 of the semiconductor device 1 changes to a voltage between the medium voltage VM and the low voltage VL, the semiconductor device 1 performs the operation described above with reference to FIG. 5. In other words, the first switch SW1 may be softly turned on, the second switch SW2 may be turned on, and the third and fourth switches SW3 and SW4 may be turned off.

Subsequently, when the generated output voltage Vout2 reaches a target voltage and the load capacitor C1 is fully charged, the semiconductor device 1 operates in the first state S1 in which the generated output voltage Vout2 is kept constant between the medium voltage VM and the low voltage VL. In this case, the semiconductor device 1 may perform the operation described above with reference to FIG. 4 again.

Referring to FIG. 9, in the first state S1 in which the generated output voltage Vout2 of the semiconductor device 1 is kept constant between the medium voltage VM and the low voltage VL, the semiconductor device 1 performs the operation described above with reference to FIG. 4. In other words, the first switch SW1 may be turned on, the second and third switches SW2 and SW3 may be turned off, and the fourth switch SW4 may be turned on.

Subsequently, in the second state S2 in which the generated output voltage Vout2 of the semiconductor device 1 changes to a voltage between the medium voltage VM and the low voltage VL, the semiconductor device 1 performs the operation described above with reference to FIG. 5. In other words, the first switch SW1 may be softly turned on, the second switch SW2 may be turned on, and the third and fourth switches SW3 and SW4 may be turned off.

Subsequently, when the generated output voltage Vout2 reaches a target voltage and the load capacitor C1 is fully charged, the semiconductor device 1 operates again in the first state S1 in which the generated output voltage Vout2 is kept constant between the medium voltage VM and the low voltage VL. In this case, the semiconductor device 1 may perform the operation described above with reference to FIG. 4.

Figure 10:
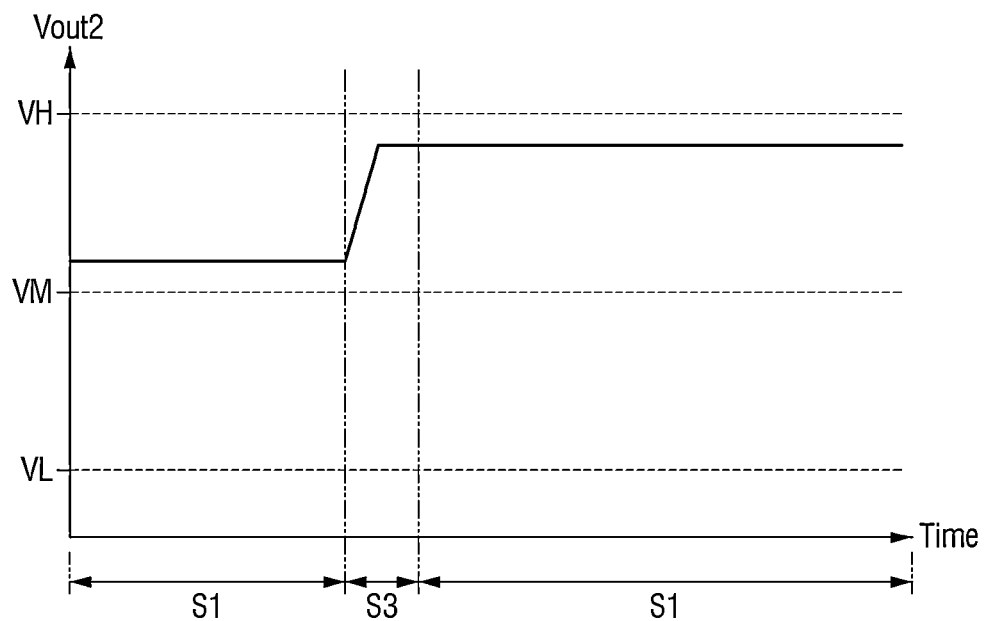
FIG. 10 is a timing diagram illustrating an operation of a semiconductor device according to still other example embodiments.
Figure 11:
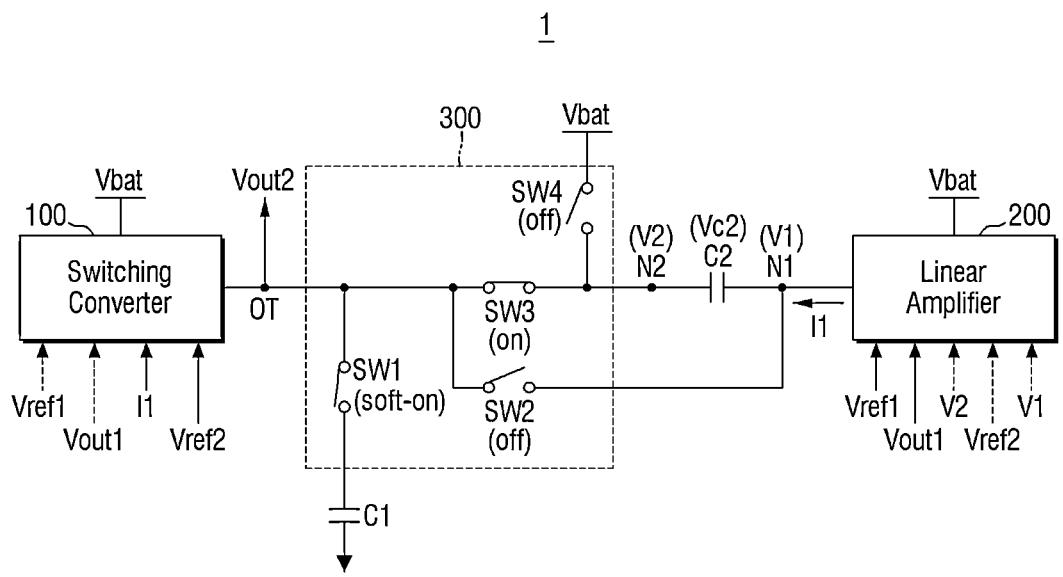
FIG. 11 is a diagram illustrating an operation of a semiconductor device according to still other example embodiments.

FIG. 10 is a timing diagram illustrating an operation of a semiconductor device according to still other example embodiments. FIG. 11 is a diagram illustrating an operation of a semiconductor device according to still other example embodiments.

Referring to FIG. 10, in the first state S1 in which the generated output voltage Vout2 of the semiconductor device 1 is kept constant between the medium voltage VM and the high voltage VH, the semiconductor device 1 performs the operation described above with reference to FIG. 4. In other words, at the start of the first state S1 the first switch SW1 may be turned on, the second and third switches SW2 and SW3 may be turned off, and the fourth switch SW4 may be turned on.

Next, referring to FIGS. 10 and 11, in a third state S3 in which the output voltage Vout2 of the semiconductor device 1 changes to a voltage between the medium voltage VM and the high voltage VH, the first switch SW1 is softly turned on, the second switch SW2 is turned off, the third switch SW3 is turned on, and the fourth switch SW4 is turned off.

The switching converter 100 operates on the basis of the output current I1 of the linear amplifier 100 and the voltage Vc2 of the AC coupling capacitor C2, and the first switch SW1 is softly turned on (the transistor is weakly turned on). Accordingly, the load capacitor C1 is slowly charged to a voltage corresponding to the generated output voltage Vout2 by an output current of the switching converter 100 or the voltage Vc2 of the AC coupling capacitor C2.

The linear amplifier 200 operates on the basis of the first reference voltage Vref1 and the output voltage Vout1, and the third switch SW3 is turned on. Accordingly, the generated output voltage Vout2 is generated from the voltage Vc2 of the AC coupling capacitor C2 charged in the first state S1. That is, the generated output voltage Vout2 can rapidly increase to a higher voltage level than the power supply voltage Vbat using the voltage Vc2 of the AC coupling capacitor C2. In other words, the semiconductor device 1 according to the present embodiment can allow the generated output voltage Vout2 to rapidly increase to a higher voltage level than the power supply voltage Vbat using the AC coupling capacitor C2.

In this case, the load capacitor C1 having a large capacity is weakly connected to the output terminal OT (the first switch SW1 is softly turned on) and thus is slowly charged to a voltage corresponding to the generated output voltage Vout2. Also, the load capacitor C1 does not reduce the speed at which the output voltage Vout increases to a target voltage.

Referring to FIG. 10, when the output voltage Vout reaches the target voltage and the load capacitor C1 is fully charged, the semiconductor device 1 operates again in the first state S1 in which the output voltage Vout is kept constant between the medium voltage VM and the high voltage VH. In this case, the semiconductor device 1 performs the operation described above with reference to FIG. 4.

Figure 12:
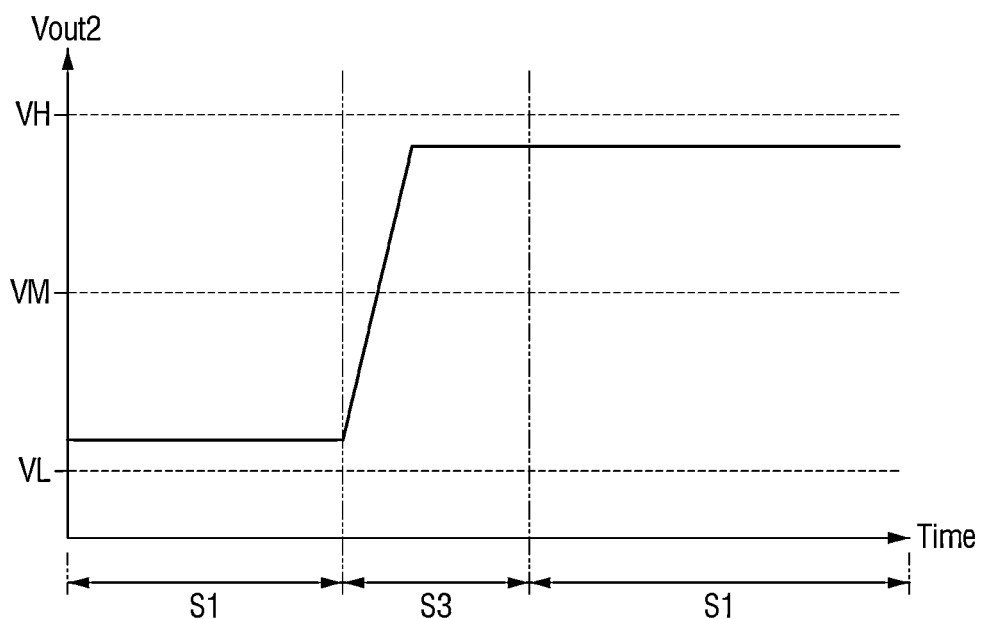
FIGS. 12 and 13 are timing diagrams illustrating an operation of a semiconductor device according to still other example embodiments.
Figure 13:
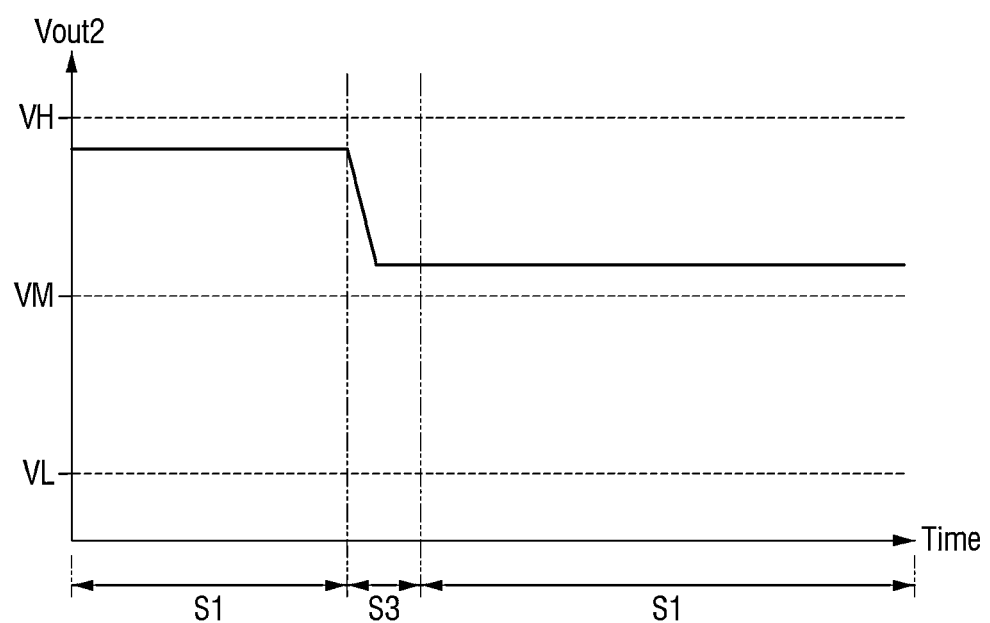

FIGS. 12 and 13 are timing diagrams illustrating an operation of a semiconductor device according to still other example embodiments.

Referring to FIG. 12, in the first state S1 in which the output voltage Vout of the semiconductor device 1 is kept constant between the medium voltage VM and the low voltage VL, the semiconductor device 1 performs the operation described above with reference to FIG. 4. In other words, the first switch SW1 may be turned on, the second and third switches SW2 and SW3 may be turned off, and the fourth switch SW4 may be turned on.

Subsequently, in the third state S3 in which the output voltage Vout of the semiconductor device 1 changes to a voltage between the medium voltage VM and the high voltage VH, the semiconductor device 1 performs the operation described above with reference to FIG. 11. In other words, the first switch SW1 may be softly turned on, the second switch SW2 may be turned off, the third switch SW3 may be turned on, and the fourth switch SW4 may be turned off.

Subsequently, when the generated output voltage Vout2 reaches a target voltage and the load capacitor C1 is fully charged, the semiconductor device 1 operates again in the first state S1 in which the output voltage Vout is kept constant between the medium voltage VM and the high voltage VH. In this case, the semiconductor device 1 may perform the operation described above with reference to FIG. 4 again.

Next, referring to FIG. 13, in the first state S1 in which the generated output voltage Vout2 of the semiconductor device 1 is kept constant between the medium voltage VM and the high voltage VH, the semiconductor device 1 performs the operation described above with reference to FIG. 4. In other words, the first switch SW1 may be turned on, the second and third switches SW2 and SW3 may be turned off, and the fourth switch SW4 may be turned on.

Subsequently, in the third state S3 in which the generated output voltage Vout2 of the semiconductor device 1 changes to a voltage between the medium voltage VM and the high voltage VH, the semiconductor device 1 performs the operation described above with reference to FIG. 11. In other words, the first switch SW1 may be softly turned on, the second switch SW2 may be turned off, the third switch SW3 may be turned on, and the fourth switch SW4 may be turned off.

Subsequently, when the generated output voltage Vout2 reaches a target voltage and the load capacitor C1 is fully charged, the semiconductor device 1 operates again in the first state S1 in which the generated output voltage Vout2 is kept constant between the medium voltage VM and the high voltage VH again. In this case, the semiconductor device 1 may perform the operation described above with reference to FIG. 4 again.

Figure 14:
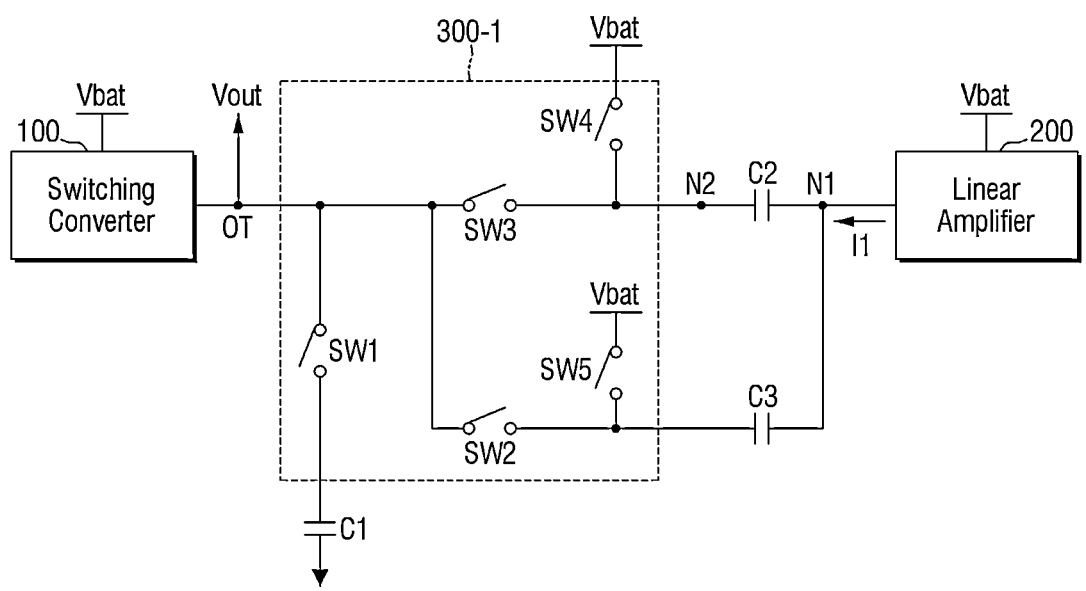
FIG. 14 is a diagram illustrating a semiconductor device according to other example embodiments.

FIG. 14 is a diagram illustrating a semiconductor device according to other example embodiments. Herein, like reference numerals refer to like elements and therefore differences from the above-described embodiments will be mainly described below.

Referring to FIG. 14, a semiconductor device 2 according to the present embodiment may further include an AC coupling capacitor C3. Also, a switching circuit 300-1 of the semiconductor device 2 may further include a switch SW5 disposed between the AC coupling capacitor C3 and a power supply voltage Vbat.

Accordingly, the semiconductor device 2 can charge the AC coupling capacitor C2 and the AC coupling capacitor C3 using a linear amplifier 200 during a period in which an output voltage Vout (e.g., corresponding to the generated output voltage Vout2 of the above-described embodiments) is kept constant and rapidly change the output voltage Vout to a target voltage using at least one of the AC coupling capacitor C2 and the AC coupling capacitor C3 during a period in which the output voltage Vout is changed. During a period in which the output voltage Vout is changed, a first switch SW1 is softly turned on, and thus the output voltage Vout can be rapidly changed despite a load capacitor CL having a large capacity.

Figure 15:
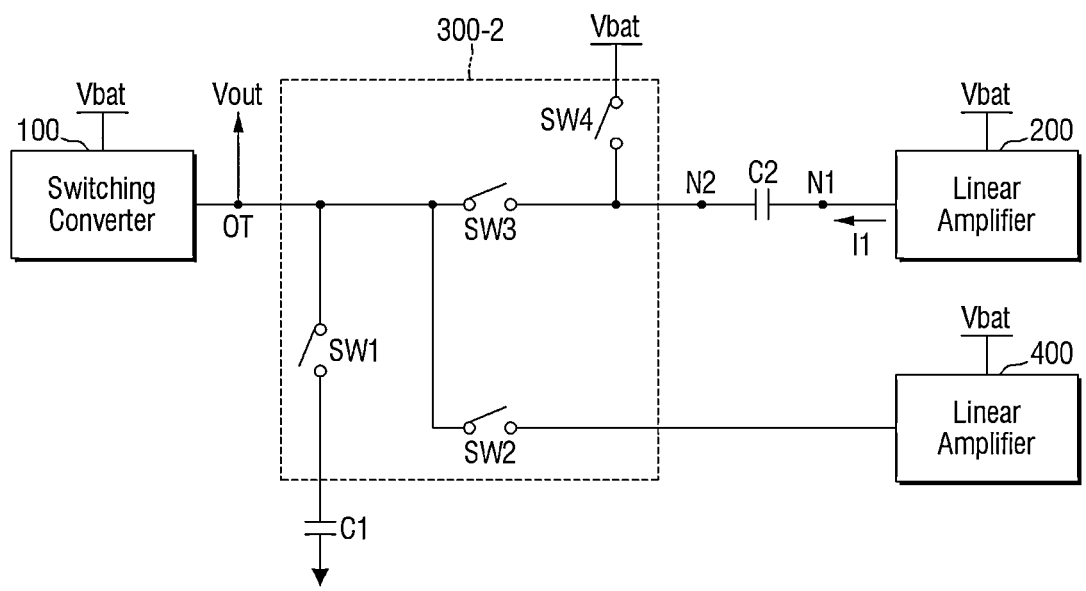
FIG. 15 is a diagram illustrating a semiconductor device according to still other example embodiments.

FIG. 15 is a diagram illustrating a semiconductor device according to still other example embodiments. Likewise, differences from the above-described embodiments will be mainly described below.

Referring to FIG. 15, a semiconductor device 3 according to the present embodiment may further include a linear amplifier 400. Also, a second switch SW2 of a switching circuit 300-2 of the semiconductor device 3 may be disposed between the linear amplifier 400 and an output terminal OT.

Accordingly, the semiconductor device 3 can charge an AC coupling capacitor C2 using a linear amplifier 200 during a period in which an output voltage Vout is kept constant, rapidly change the output voltage Vout to a target voltage using the linear amplifier 400 during a period in which the output voltage Vout changes to a low voltage, and rapidly change the output voltage Vout to a target voltage using the AC coupling capacitor C2 during a period in which the output voltage Vout changes to a high voltage. During a period in which the output voltage Vout is changed, a first switch SW1 is softly turned on, and thus the output voltage Vout can be rapidly changed despite a load capacitor CL having a large capacity.

Figure 16:
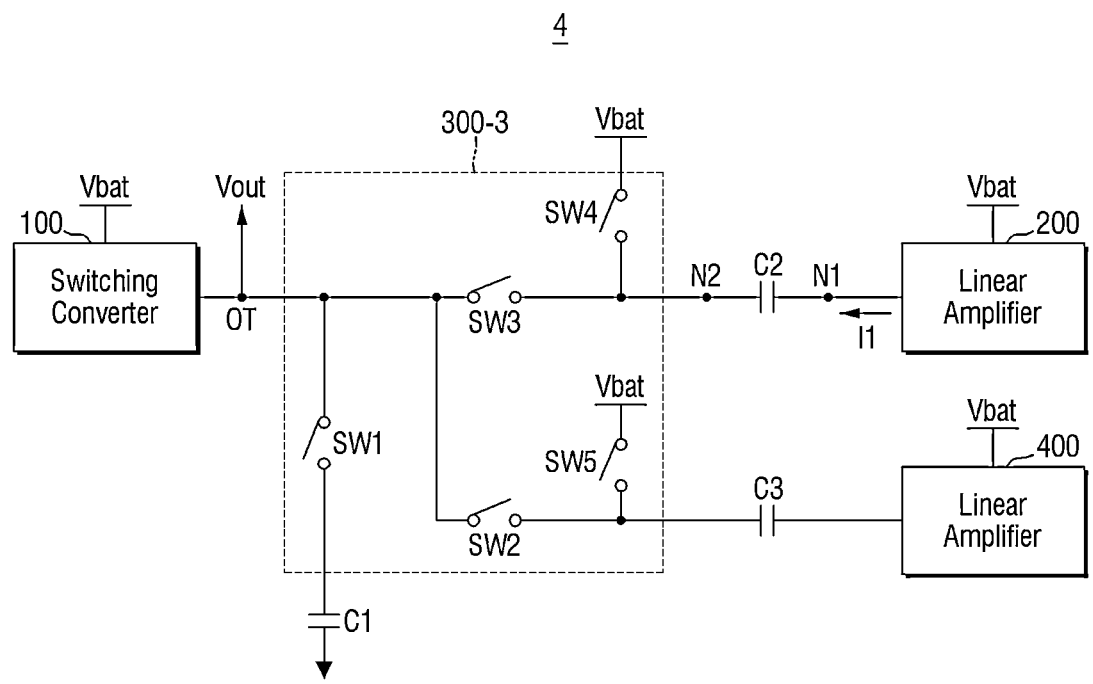
FIG. 16 is a diagram illustrating a semiconductor device according to yet other example embodiments.

FIG. 16 is a diagram illustrating a semiconductor device according to yet other example embodiments. Likewise, differences from the above-described embodiments will be mainly described below.

Referring to FIG. 16, a semiconductor device 4 according to the present embodiment may further include a linear amplifier 400 and an AC coupling capacitor C3. Also, a switching circuit 300-3 of the semiconductor device 4 may further include a switch SW5 disposed between the AC coupling capacitor C3 and a power supply voltage Vbat and a second switch SW2 may be disposed between the AC coupling capacitor C3 and an output terminal OT.

Accordingly, during a period in which an output voltage Vout is kept constant, the semiconductor device 4 can charge an AC coupling capacitor C2 using a linear amplifier 200 and charge the AC coupling capacitor C3 using the linear amplifier 400.

Also, during a period in which the output voltage Vout is changed, the semiconductor device 4 can rapidly change the output voltage Vout to a target voltage using at least one of the AC coupling capacitor C2 and the AC coupling capacitor C3. During the period in which the output voltage Vout is changed, a first switch SW1 is softly turned on, and thus the output voltage Vout can be rapidly changed despite a load capacitor CL having a large capacity.

Figure 17:
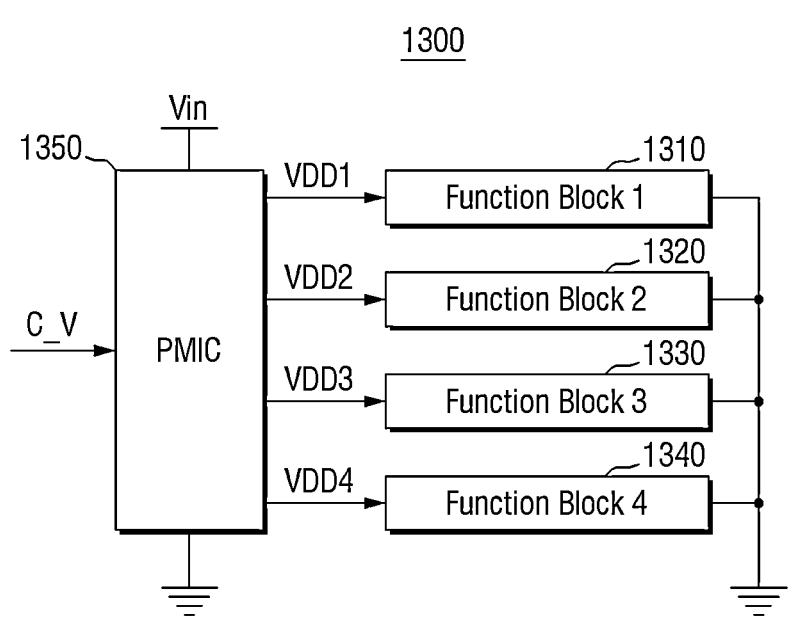
FIG. 17 is a diagram illustrating a semiconductor system according to some example embodiments.

FIG. 17 is a diagram illustrating a semiconductor system according to some example embodiments.

In some example embodiments, for example, a semiconductor system 1300 may include a semiconductor integrated circuit, such as a system-on-chip (SoC), and/or may include a printed circuit board and packages mounted thereon.

As shown in FIG. 17, the semiconductor system 1300 may include first to fourth function blocks 1310 to 1340 and a power management integrated circuit (PMIC) 1350.

The first to fourth function blocks 1310 to 1340 may operate on the basis of power provided by first to fourth supply voltages VDD1 to VDD4 output by the PMIC 1350.

For example, at least one of the first to fourth function blocks 1310 to 1340 may be a digital circuit (such as an application processor (AP) and/or the like) that processes digital signals, an analog circuit (such as an amplifier and/or the like) that processes analog signals and/or a circuit (such as an analog-to-digital converter (ADC) and/or the like) that processes a mixed signal.

Although FIG. 17 shows that the semiconductor system 1300 includes four function blocks and four supply voltages the example embodiments are not limited thereto, and the semiconductor system 1300 may include fewer than four or five or more function blocks and a corresponding number of supply voltages in other embodiments.

The PMIC 1350 may generate the first to fourth supply voltages VDD1 to VDD4 from an input voltage Vin and change the level of at least one of the first to fourth supply voltages VDD1 to VDD4 according to a voltage control signal C_V. At least one of the first to fourth function blocks 1310 to 1340 may receive a supply voltage of a level that dynamically varies depending on required performance and power consumption.

For example, in some example embodiments, the first function block 1310 may be an image processor that processes image data. The first function block 1310 may receive the first supply voltage VDD1 having a high level while processing a video including a series of images. Meanwhile, the first function block 1310 may receive the first supply voltage VDD1 having a low level while processing a photo including a single image.

The PMIC 1350 may receive the voltage control signal CV corresponding to performance and power consumption required by the first function block 1310 and increase or decrease the level of the first supply voltage VDD1 on the basis of the voltage control signal C_V. Such a method of dynamically changing the level of a supply voltage for a function block may be referred to as dynamic voltage scaling (DVS).

In some example embodiments, the PMIC 1350 may include the above-described semiconductor device, and accordingly the level of the first supply voltage VDD1 may be rapidly changed. For example, in this case, the first supply voltage VDD1 may correspond to the generated output voltage Vout2, the voltage input Vin may correspond to the power supply voltage Vbat, and the voltage control signal CV may include the received voltage output Vout1, the first reference voltage Vref1, the second reference voltage Vref2, and/or control signals for the switches SW1 through SW4. In some example embodiments, the voltage control signal C_V may be received from a control unit and/or processor (not illustrated). The control unit may, for example, be (or include) processing circuitry configured to control the PMIC 1350. In some example embodiments, the first function block 1310 may stop an operation while the level of the first supply voltage VDD1 is changed and may restart the operation after the level of the first supply voltage VDD1 is changed. Accordingly, when the level of the first supply voltage VDD1 is rapidly changed, a time in which the first function block 1310 performs the operation may be reduced, and as a result, the semiconductor system 1300 can provide improved performance.

Figure 18:
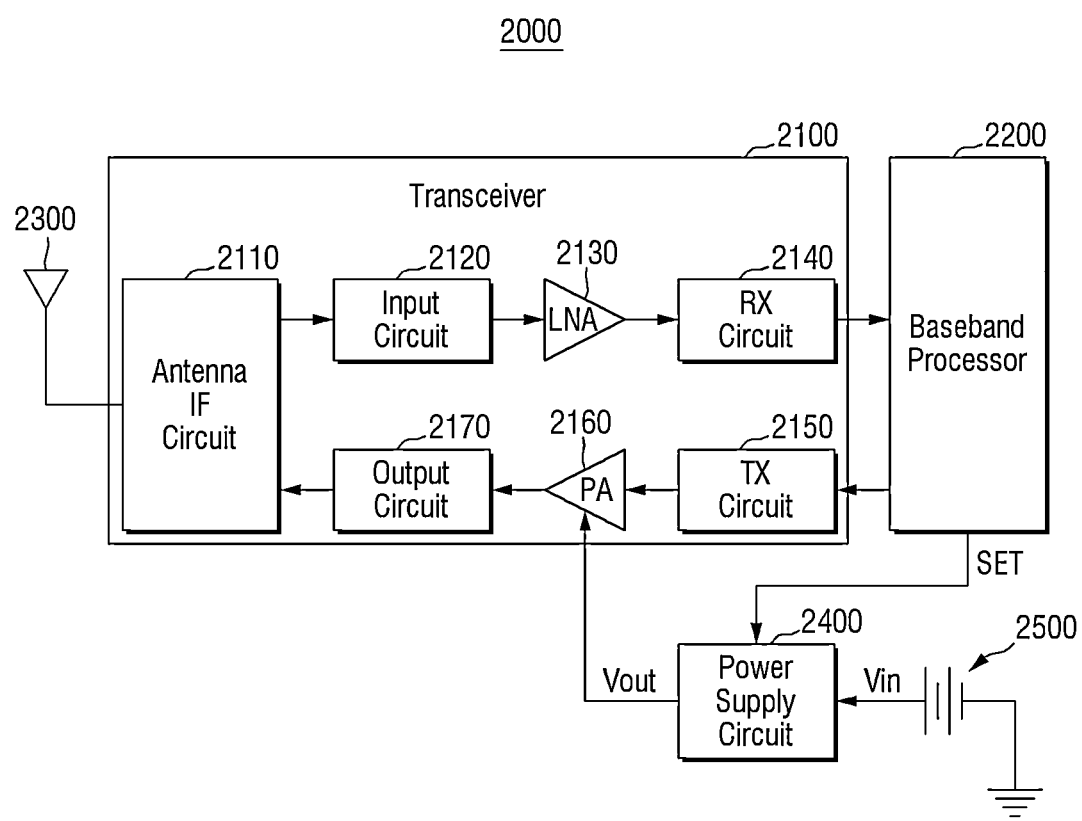
FIG. 18 is a block diagram illustrating a wireless communication device according to some example embodiments.

FIG. 18 is a block diagram illustrating a wireless communication device according to some example embodiments. Specifically, FIG. 18 shows user equipment (UE) (or a terminal) that is supplied with power by a battery 2500.

In some example embodiments, a wireless communication device 2000 may be included in a wireless communication system employing a cellular network, such as fifth generation (5G), Long Term Evolution (LTE), etc., or included in a wireless local area network (WLAN) system or arbitrary wireless communication system.

In the wireless communication device 2000, the above-described semiconductor devices may be used for providing variable power to a power amplifier 2160.

As shown in FIG. 18, the wireless communication device 2000 may include a transceiver 2100, a baseband processor 2200, an antenna 2300, a power supply circuit 2400, and a battery 2500.

The transceiver 2100 may include an antenna interface circuit 2110 and may include a receiver which includes an input circuit 2120, a low-noise amplifier 2130, and a reception circuit 2140, and a transmitter which includes a transmission circuit 2150, a power amplifier 2160, and an output circuit 2170.

The antenna interface circuit 2110 may connect the transmitter and/or receiver to the antenna 2300 according to a transmission mode or reception mode. In some example embodiments, the input circuit 2120 may include a matching circuit and/or filter, the low-noise amplifier 2130 may amplify an output signal of the input circuit 2120, and the reception circuit 2140 may include a mixer for down-conversion.

In some example embodiments, the transmission circuit 2150 may include a mixer for up-conversion, the power amplifier 2160 may amplify an output signal of the transmission circuit 2150, and the output circuit 2170 may include a matching circuit and/or filter.

The baseband processor 2200 may transmit and receive baseband signals to and from the transceiver 2100 and perform modulation/demodulation, encoding/decoding, etc. In some example embodiments, the baseband processor 2200 may be referred to as a "modem." The baseband processor 2200 may generate a setting signal SET for setting an average power tracking mode and an envelope tracking mode and generate a setting signal SET for changing the level of an output voltage Vout. In some example embodiments, for example, the setting signal SET may correspond to the voltage control signal C_V described above.

The power supply circuit 2400 may receive an input voltage Vin (e.g., Vbat of the above-described embodiments) from the battery 2500 and generate the output voltage Vout for providing power to the power amplifier 2160. The power supply circuit 2400 may include the above-described semiconductor devices and can rapidly change the level of the output voltage Vout.

Although example embodiments of the present disclosure have been described above with reference to the accompanying drawings, the present disclosure is not limited thereto and can be manufactured in various different forms. It will be understood by those of ordinary skill in the art that the present disclosure can be implemented in other specific forms without changing the technical spirit or essential characteristics of the present disclosure. Therefore, the above-described embodiments should be considered as illustrative rather than restrictive in all aspects.

What is claimed is:

1. A semiconductor device comprising:
an output terminal;
a switching converter configured to control an output voltage output from the output terminal based on a first reference voltage;
a load capacitor configured to be charged with a voltage corresponding to the output voltage;
a linear amplifier connected to one end of an alternating current (AC) coupling capacitor and configured to control a voltage of the AC coupling capacitor based on a second reference voltage; and
a switching circuit connected between the output terminal, the load capacitor and the AC coupling capacitor and configured to control a charging speed of the load capacitor and to control a connection between the output terminal and the one end of the AC coupling capacitor and a connection between the output terminal and another end of the AC coupling capacitor.

2. The semiconductor device of claim 1, wherein the switching circuit is configured to charge the load capacitor at a first speed when the output voltage is in a first state and to charge the load capacitor at a second speed, which is lower than the first speed, when the output voltage is in a second state.

3. The semiconductor device of claim 2, wherein the switching circuit includes
a transistor between the switching converter and the load capacitor, and
the transistor is completely turned on in the first state and partially turned on in the second state.

4. The semiconductor device of claim 3, wherein
in the first state, the first reference voltage is maintained within a range, and
in the second state, the first reference voltage deviates from the range.

5. The semiconductor device of claim 1, wherein
in a first state, the switching circuit does not connect either of the one end and the other end of the AC coupling capacitor to the output terminal, and
in a second state, the switching circuit connects the one end of the AC coupling capacitor to the output terminal and does not connect the other end of the AC coupling capacitor to the output terminal.

6. The semiconductor device of claim 5, wherein, in a third state, the switching circuit does not connect the one end of the AC coupling capacitor to the output terminal and connects the other end of the AC coupling capacitor to the output terminal.

7. The semiconductor device of claim 1, wherein the switching circuit includes
a first switch between the one end of the AC coupling capacitor and the output terminal; and
a second switch between the other end of the AC coupling capacitor and the output terminal.

8. The semiconductor device of claim 7, wherein the switching circuit further includes a third switch configured to control whether a power supply voltage is applied to the other end of the AC coupling capacitor.

9. A semiconductor device comprising:
an output terminal;
a switching converter configured to control an output voltage output from the output terminal based on a first reference voltage and a power supply voltage;
a load capacitor configured to be charged with a voltage corresponding to the output voltage;
a linear amplifier connected to one end of an alternating current (AC) coupling capacitor and configured to control a voltage of the AC coupling capacitor based on a second reference voltage and the power supply voltage;
a first switch configured to control a connection between the output terminal and the load capacitor;
a second switch configured to control a connection between the output terminal and the one end of the AC coupling capacitor; and
a third switch configured to control a connection between the output terminal and another end of the AC coupling capacitor.

10. The semiconductor device of claim 9, wherein
the first switch includes a transistor,
in a first state in which the output voltage is kept constant, the first switch is completely turned on, the second switch does not connect the one end of the AC coupling capacitor and the output terminal, and the third switch does not connect the other end of the AC coupling capacitor and the output terminal, and in a second state in which the output voltage changes to a lower voltage than a set voltage, the first switch is partially turned on, the second switch connects the one end of the AC coupling capacitor and the output terminal, and the third switch does not connect the other end of the AC coupling capacitor and the output terminal.

11. The semiconductor device of claim 9, wherein the first switch includes a transistor, in a first state in which the output voltage is kept constant, the first switch is completely turned on, the second switch does not connect the one end of the AC coupling capacitor and the output terminal, and the third switch does not connect the other end of the AC coupling capacitor and the output terminal, and in a second state in which the output voltage changes to a higher voltage than a set voltage, the first switch is softly turned on, the second switch does not connect the one end of the AC coupling capacitor and the output terminal, and the third switch connects the other end of the AC coupling capacitor and the output terminal.

12. The semiconductor device of claim 9, wherein in a first state in which the output voltage changes to a lower voltage than a set voltage, the second switch connects the one end of the AC coupling capacitor and the output terminal, and the third switch does not connect the other end of the AC coupling capacitor and the output terminal, and in a second state in which the output voltage changes to a higher voltage than the set voltage, the second switch does not connect the one end of the AC coupling capacitor and the output terminal, and the third switch connects the other end of the AC coupling capacitor and the output terminal.

13. The semiconductor device of claim 12, wherein the first switch includes a transistor, and the transistor is softly turned on in the first and second states and completely turned on in a third state in which the output voltage is kept constant.

14. The semiconductor device of claim 9, further comprising:

a fourth switch configured to control whether a power supply voltage is applied to the other end of the AC coupling capacitor.

15. The semiconductor device of claim 9, wherein the switching converter is configured to receive a voltage to be output to the output terminal, an output current of the linear amplifier, and the voltage of the AC coupling capacitor.

16. The semiconductor device of claim 15, wherein the linear amplifier is configured to receive the voltage to be output to the output terminal, the first reference voltage, the output current of the linear amplifier, a first voltage to be output by the linear amplifier to the end of the AC coupling capacitor, and a second voltage of the other end of the AC coupling capacitor.

17. A semiconductor device comprising:

an output terminal;

a switching converter configured to control an output voltage output by the output terminal based a first reference voltage and a power supply voltage;

a load capacitor configured to be charged with a voltage corresponding to the output voltage; and a first linear amplifier connected to one end of a first alternating current (AC) coupling capacitor and configured to control a voltage of the first AC coupling capacitor based on a second reference voltage and the power supply voltage, wherein, in a first state in which the output voltage is kept constant, the switching converter is configured to generate the output voltage, and the first linear amplifier is configured to charge the first AC coupling capacitor, in a second state in which the output voltage changes to a first voltage lower than a set voltage, the first linear amplifier is configured to generate the output voltage without using the first AC coupling capacitor, and in a third state in which the output voltage changes to a second voltage higher than the set voltage, the first linear amplifier is configured to generate the output voltage using the first AC coupling capacitor.

18. The semiconductor device of claim 17, further comprising:

a second AC coupling capacitor connected to the first linear amplifier, wherein, in the second state, the first linear amplifier is configured to generate the output voltage using the second AC coupling capacitor.

19. The semiconductor device of claim 17, further comprising:

a second linear amplifier, wherein, in the second state, the first linear amplifier is configured to not generate the output voltage, and the second linear amplifier is configured to generate the output voltage.

20. The semiconductor device of claim 19, further comprising:

a second AC coupling capacitor connected to the first linear amplifier, wherein, in the second state, the second linear amplifier is configured to generate the output voltage using the second AC coupling capacitor.

* * * * *